(12) United States Patent
Hartmann et al.

(10) Patent No.: US 9,887,690 B2
(45) Date of Patent: Feb. 6, 2018

(54) INDUCTIVE ISOLATION OF VOLTAGE SOURCES OF AN INDUCTIVE VOLTAGE ADDER BY INDIVIDUAL COUPLED COILS

(71) Applicant: SIEMENS AKTIENGESELLSCHAFT, Munich (DE)

(72) Inventors: Werner Hartmann, Weisendorf (DE); Martin Hergt, Nuremberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 189 days.

(21) Appl. No.: 14/786,429

(22) PCT Filed: Feb. 7, 2014

(86) PCT No.: PCT/EP2014/052413
§ 371 (c)(1),
(2) Date: Mar. 31, 2016

(87) PCT Pub. No.: WO2014/173553
PCT Pub. Date: Oct. 30, 2014

(65) Prior Publication Data
US 2016/0226470 A1 Aug. 4, 2016

(30) Foreign Application Priority Data
Apr. 23, 2013 (DE) ......................... 10 2013 207 329

(51) Int. Cl.
*H03K 3/02* (2006.01)
*H03K 3/53* (2006.01)
(52) U.S. Cl.
CPC ................. *H03K 3/02* (2013.01); *H03K 3/53* (2013.01)

(58) Field of Classification Search
CPC .................................. H03K 3/02; H03K 3/53
See application file for complete search history.

(56) References Cited

U.S. PATENT DOCUMENTS

| 4,274,134 A | 6/1981 | Johannessen .................... 363/59 |
| 5,142,166 A | 8/1992 | Birx ............................... 307/419 |

(Continued)

FOREIGN PATENT DOCUMENTS

| DE | 10 2013 207 329.1 | 4/2013 | |
| DE | 102013200844 A1 | 7/2014 | ............... H03K 3/53 |

(Continued)

OTHER PUBLICATIONS

Hansjoachim Bluhm, "Pulsed Power Systems Principles and Applications", Springer-Verlag, Berlin Heidelberg 2006, pp. I-XV & 193-201.

(Continued)

*Primary Examiner* — Jung Kim
(74) *Attorney, Agent, or Firm* — Slayden Grubert Beard PLLC

(57) ABSTRACT

A transformer including a coaxial transmission line and a series circuit of discrete stages of voltage sources arranged along a main axis of wave propagation. Electromagnetic waves are propagated along the coaxial transmission line in each stage and are coupled in the coaxial transmission line by pulse currents. Each stage has a coupling-in inductance formed by discrete inductances that generate the pulse currents. The discrete inductances are magnetically coupled to each other such that magnetic fluxes of the discrete inductances are superimposed on one another and added to one another along a circular line that is rotationally symmetrical to the main axis of wave propagation.

26 Claims, 5 Drawing Sheets

(56) References Cited

U.S. PATENT DOCUMENTS

| | | | | |
|---|---|---|---|---|
| 5,448,580 | A | 9/1995 | Birx et al. | 372/38.1 |
| 5,525,805 | A | 6/1996 | Greenly | 250/423 R |
| 6,728,284 | B1 | 4/2004 | Birx et al. | 372/82 |
| 8,575,868 | B2 * | 11/2013 | Caporaso | H05H 7/00 |
| | | | | 313/359.1 |
| 2001/0030527 | A1 | 10/2001 | Iida et al. | 323/251 |
| 2003/0128554 | A1 | 7/2003 | Crewson et al. | |

FOREIGN PATENT DOCUMENTS

| | | | | |
|---|---|---|---|---|
| JP | 0729755 A | 1/1995 | | H01F 37/00 |
| JP | 2000348943 A | 12/2000 | | H01F 17/06 |
| JP | 2001085233 A | 3/2001 | | H01F 17/04 |
| JP | 2001238470 A | 8/2001 | | H02M 1/08 |
| JP | 2001297922 A | 10/2001 | | H01F 17/04 |
| JP | 2009224687 A | 10/2009 | | H01F 17/06 |
| WO | PCT/EP2014/052413 | 2/2014 | | |

OTHER PUBLICATIONS

Houxin Xiao et al., "Modeling a 3.5 Mev Induction Voltage Adder", IEEE Transactions on Dielectrics and Electrical Insulation, vol. 14, No. 4, Aug. 2007, pp. 907-912.

Yu Lei et al., "Design of a Novel Multi-Output Synchronous Trigger Generator for Linear Transformer Driver", Pulsed Power Conference (PPC), IEEE 2011, pp. 629-635.

Zhuolin Tu et al., "A New Triggering Technology Based on Inductive Transformer for LTD Switches", Power Modulator and High Voltage Conference (IPMHVC), IEEE, 2012 International, pp. 207-210.

International Search Report dated Jun. 24, 2014 in corresponding International patent application No. PCT/EP2014/052413.

* cited by examiner

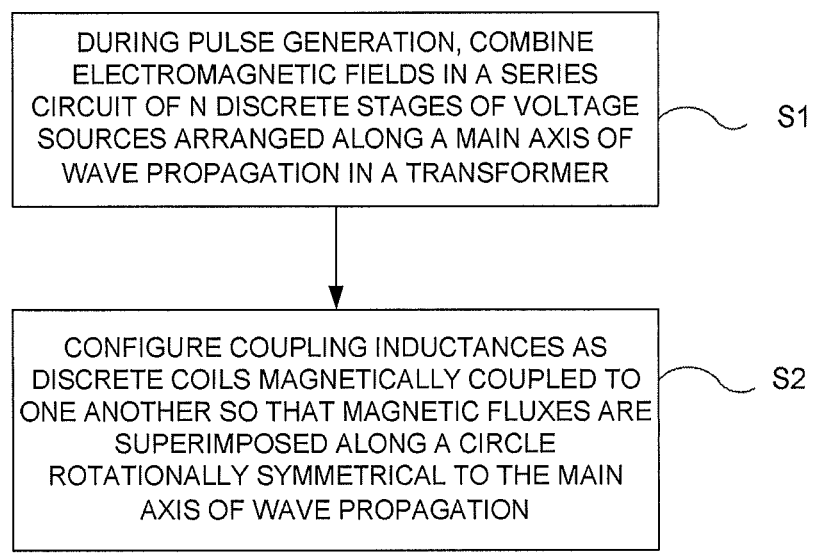

INDUCTIVE ISOLATION OF VOLTAGE SOURCES OF AN INDUCTIVE VOLTAGE ADDER BY INDIVIDUAL COUPLED COILS

CROSS REFERENCE TO RELATED APPLICATIONS

This application is based on and hereby claims priority to International Application No. PCT/EP2014/052413 filed on Feb. 7, 2014 and German Application No. 10 2013 207 329.1 filed on Apr. 23, 2013; the contents of both are hereby incorporated by reference.

BACKGROUND

In electrical engineering, in the field of pulsed power technology, high-voltage and high power pulses of amplitude ranging from a few kW to several hundred TW are used for scientific and industrial purposes, whereby pulse durations lie within the ps to ms range.

For "electroporation", which is specified here as an example of an industrial application, a pulse generator is required which is capable of generating, for example, voltages of 250 kV and currents of several 10 kA with a pulse duration ranging from 1 μs to 2 μs.

A potential topology for the execution of a pulse generator of this type is an "inductive voltage adder", abbreviated to "IVA". A generator of this type can employ a compact form of construction on the grounds that, during pulse generation, the latter includes a series circuit of n discrete voltage sources.

In the stationary state, the voltage sources are wired together in parallel, during the pulse phase, according to the related art, the latter are uncoupled by an inductance and, as dictated by the topology of the IVA, are combined to form a series circuit.

"Pulsed Power Systems Principles and Applications", Hansjoachim Bluhm, Springer Verlag Berlin Heidelberg, 2006, specifically in chapter 7, pages 192-201, discloses the structure and operating methods of IVAs.

The value of the inductance for this purpose is defined by the geometry and the susceptibility of the core material. The inductance must show a sufficiently high response to the pulse to permit the mutual formation of a series circuit of voltage sources, while preventing any substantial losses associated with the flow of currents via the inductances on the ground side.

Accordingly, for pulse durations e.g. of 0.1 to 50 μs, the inductance for the series connection of the voltage sources essentially dictates the volume and the costs of the IVA.

In an IVA, the wave properties associated with reflection factors can be employed, during the closing operation and in the stationary state, to increase the current amplitude. FIG. 1 shows a known circuit layout of an IVA. FIG. 1 shows the basic layout of an IVA, based upon the example of four stages. In a similar manner to a series arrangement of voltage sources, represented on the left-hand side of FIG. 1, pulse cables, as represented on the right-hand side of FIG. 1, may be configured as voltage multiplier circuits, wherein the positive conductor of one cable is connected to the negative conductor of another. Given that, in this alternating connection of conductors, no short-circuit is produced, the connection must be isolated for the duration of the pulse. As is known, this is achieved by the employment of transmission lines of sufficient length, in the form of a cable transformer, or by coupling with sufficiently high coupling inductances, corresponding to the form of embodiment of an IVA. A more compact form of construction is possible if the transfer time is replaced by an inductive infeed associated with the combination of the pulse cables of individual stages. The principle of voltage addition by magnetic infeed, in accordance with the IVA, is represented in FIG. 2.

FIG. 2 shows a known example of an embodiment of an IVA with magnetic isolation. FIG. 2 shows six stages, which are arranged coaxially. Reference number 1 designates a vacuum interface, reference number 3 designates a vacuum, reference number 5 designates an annular gap, reference number 7 designates a magnetic core, reference number 9 designates a particle stream gap for the generation of electron or ion streams in a vacuum, and reference number 11 designates oil. The cylindrical cavities form an internal conductor of the IVA, and are supplied radially by known, coaxially-arranged voltage sources Ux. In the applications described, each of the individual cavities delivers a pulse, for example of duration 0.1 to 50 μs, with a voltage amplitude $U_0$ of several kV, for example in the range of 3 to 10 kV, and a maximum current amplitude $I_0$ ranging from several kA to >10 kA. In order to achieve the addition of the voltage amplitudes, the vector addition of electromagnetic fields in the transition zone to the coaxial transmission line is exploited. Accordingly, the IVA generates a voltage pulse by the superimposition of the sum of the n individual voltage sources (where n is the number of stages). Correspondingly, an arrangement as shown in FIG. 2 generates a six-fold voltage pulse, in relation to the voltage sources Ux. In order to achieve the addition of the voltage amplitudes, the positive conductor of one voltage source is connected to the negative conductor of the next. By definition, a conductive connection between the middle electrode and current-distributing outer electrode in each cavity is formed accordingly. In order to prevent the consequent formation of a short-circuit at the cable output, the impedance of the connection is substantially raised by increasing the relative permeability of the section concerned. To this end, a partial volume of the voltage source is filled with annular strip-wound cores of a ferromagnetic material.

In the literature, this technique is also described as a magnetic switch. The properties of the magnetic switch are dependent upon the ferromagnetic core and the pulse duration. The following formulae apply:

$$u(t) = \frac{d\phi(t)}{dt} = A \frac{dB(t)}{dt}$$

$$\int u(t) dt = U_0 T = A(B_r + B_r)$$

The time interval during which the magnetic core may be considered as unsaturated, specifically a Vs (volts*seconds) product, is given by the cross-section of the annular core and the sum of the remnant and saturation inductance. An appropriate ferromagnetic material must show a high saturation inductance and a steep hysteresis characteristic. Given that, in the known forms of embodiment, the conductor geometry only encompasses a single winding, the cross-sectional area thereof. A must be sufficiently large such that, by this single winding, a sufficiently high inductance can be generated, which will show the required impedance in the frequency range considered. As a further condition, it is required that the magnetic core should not achieve saturation, as the inductance would otherwise fall abruptly to a low value. On these grounds, it proceeds that large volumes are to be filled with a ferromagnetic material, thereby resulting in substantial material costs, large structural volumes and heavy-duty structural arrangements for the management of the large masses involved.

SUMMARY

Various embodiments described herein relate to a device and a method for the generation of high-voltage pulses, involving the production of a more compact and more cost-effective pulse generator, in comparison with the related art. It is intended that structural expenditure for magnetic switches and the IVA should be reduced, in relation to the related art.

Various embodiments described herein relate to a configuration for the requisite inductance which overcomes the specified disadvantages of the related art. Various embodiments described herein relate to a series connection of the voltage sources. Various embodiments described herein relate to a pulse generator which is as compact and as cost-effective as possible. It has been recognized by the inventors that, by the addition of electromagnetic fields in an IVA, the structural form can be minimized. It has also been recognized by the inventors that, in the previously known coaxial structural form of an IVA, the interior space of the internal conductor and, accordingly, a considerable potential for the minimization of structural volume is not exploited.

Various embodiments described herein relate to a device for the generation of high-voltage pulses, specifically an inductive voltage adder, whereby, during pulse generation, electromagnetic fields in a series circuit of a number n of discrete stages of voltage sources arranged along a main axis of wave propagation are combined in a transformer, whereby, in each stage, electromagnetic waves are propagated along a coaxial transmission line, whereby the electromagnetic waves in each stage are coupled in the coaxial transmission line, by pulse currents, by a number of discrete inductances which generate a coupling-in inductance, specifically discrete coils, which are magnetically coupled to one another in such a way that their magnetic fluxes are superimposed on one another and added to one another along a circular line, which is rotationally symmetrical to the main axis of wave propagation.

Various embodiments described herein relate to a method for the generation of high-voltage pulses, specifically an inductive voltage adder, whereby, during pulse generation, electromagnetic fields in a series circuit of a number n of discrete stages of voltage sources arranged along a main axis of wave propagation are combined in a transformer, whereby, in each stage, electromagnetic waves are propagated along a coaxial transmission line, whereby the electromagnetic waves in each stage are coupled in the coaxial transmission line, by pulse currents, by a number of discrete inductances which generate a coupling-in inductance, specifically discrete coils, which are magnetically coupled to one another in such a way that their magnetic fluxes are superimposed on one another and added to one another along a circular line, which is rotationally symmetrical to the main axis of wave propagation.

It has been recognized by the inventors that, by an appropriate design of the inductance in the form of a number of discrete coils, it is possible to achieve an effective reduction in the pulse duration, volume and costs of the IVA.

Various embodiments described herein relate to coupling exclusively by specifically toroidal coils, such that a normal external inductance with a large iron core is superfluous. Accordingly, energy coupling is no longer affected by radial transmission lines, but exclusively by the coupling of pulse currents in toroidal coils of this type, in a coaxial arrangement.

It has been recognized by the inventors that, for the coupling of electromagnetic waves, discrete inductances, specifically in the form of discrete coils, can be used, the spatial arrangement of which is such that their fluxes are superimposed on one another or added to one another in a circumferential direction to an IVA arrangement such that, even without the use of common annular iron cores, an arrangement is achieved whereby stray magnetic fields, which would normally result in severe interference, are effectively minimized. Specifically, this can be achieved where the individual step voltages of the IVA lie within the range of several kV to several 10 kV such that, for these voltages, the electrical isolation of the discrete inductances or the discrete coils can be achieved with limited complexity. Likewise, in this voltage range, the requisite air gap is relatively straightforward to isolate electrically. Advantages are the mass reduction of an iron core associated with the use of discrete coupled inductances or discrete coupled coils, a more cost-effective and compact structural form and, accordingly, a reduction of losses, specifically in the case of long pulse durations, together with the feasibility of long pulse durations, for example >1 μs (microseconds).

In each stage, waves may be propagated respectively in a coaxial transmission line, whereby all the coaxial transmission lines of the IVA are arranged sequentially along a main axis of wave propagation.

According to the various embodiments described herein, the inductances in a given stage may be arranged along a spatial extension around the coaxial transmission line, which is rotationally symmetrical to the main axis of wave propagation.

According to a further advantageous configuration, the rotationally symmetrical spatial extension may be provided in the form of a cross-sectional surface which is circumferential to the main axis of wave propagation.

According to the various embodiments described herein, the circumferential cross-sectional surface may be a circular surface, and the rotationally symmetrical spatial extension may be a torus.

According to the various embodiments described herein, the inductances in a given stage may be discrete coils which encircle or enclose the circumferential cross-sectional surface. The advantage of this form of inductive uncoupling is that the value of the inductance, which is dictated by the number of turns N, can be massively increased by squaring to $N^2$. As is known, an iron core is provided for a number of turns N=1.

According to the various embodiments described herein, the discrete coils may be arranged side by side along the circumference of the cross-sectional surface.

According to the various embodiments described herein, each of the discrete coils may include specifically two respectively double-wound turns.

According to the various embodiments described herein, the discrete coils may be arranged on a side facing the coaxial transmission line, or on a radially-oriented side, or in a radially-oriented side.

According to the various embodiments described herein, the discrete coils may be formed as discrete air coils arranged along the rotationally symmetrical spatial extension.

By this arrangement, an air coil with a corresponding number of turns may be sufficient specifically for short pulses, such that customary restrictions, such as the saturability of a core material, critical frequency, high-frequency losses associated with eddy currents, etc., are obviated. Accordingly, an iron core and its associated disadvantages can be totally or partially eliminated.

According to the various embodiments described herein, the rotationally symmetrical spatial extension may be at least partially filled with a ferromagnetic material, specifically an iron ring or ferrite ring.

According to the various embodiments described herein, the space between two adjoining discrete coils may be at least partially filled with a ferromagnetic material, specifically an iron ring segment.

According to the various embodiments described herein, the discrete coils may include wire turns formed of litz wire, round-section wire or flat wire.

According to the various embodiments described herein, the discrete coils may be formed of two turns, into which a symmetrical infeed is arranged for the input of current from the exterior side, and out of which a symmetrical current outfeed is arranged in a center of the feed to another side of an air gap.

BRIEF DESCRIPTION OF THE DRAWINGS

These and other objects and advantages will become more apparent and more readily appreciated from the following description of the various embodiments, taken in conjunction with the accompanying drawings of which:

FIG. 9 is a flowchart of an embodiment of a method.

DETAILED DESCRIPTION OF THE PREFERRED EMBODIMENT

Figure 1:
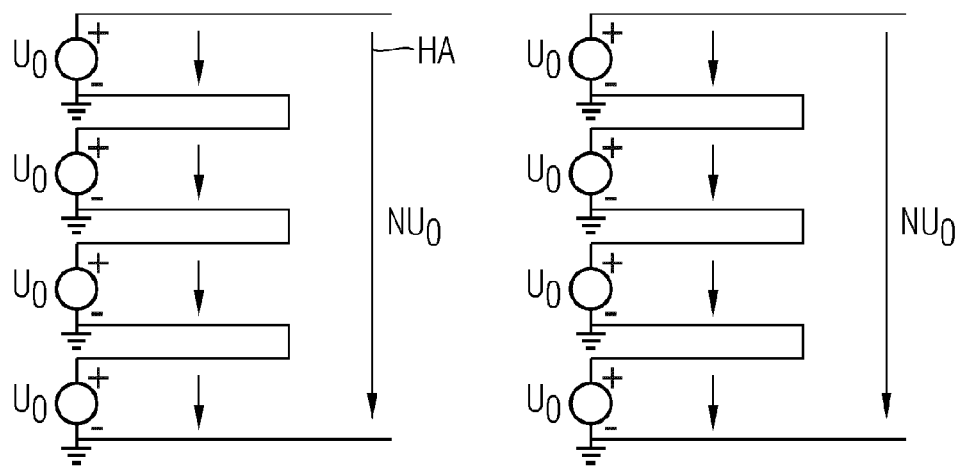
FIG. 1 is a circuit diagram of a known IVA.
Figure 2:
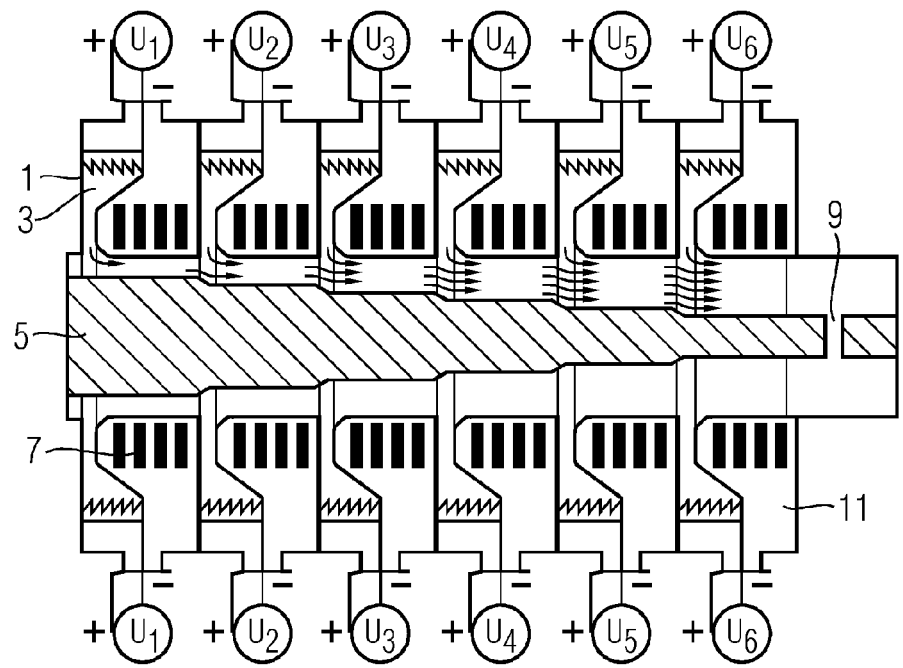
FIG. 2 is a circuit diagram and partial cross section of a further known IVA.

Reference will now be made in detail to the various embodiments, examples of which are illustrated in the accompanying drawings, wherein like reference numerals refer to like elements throughout.

Figure 3:
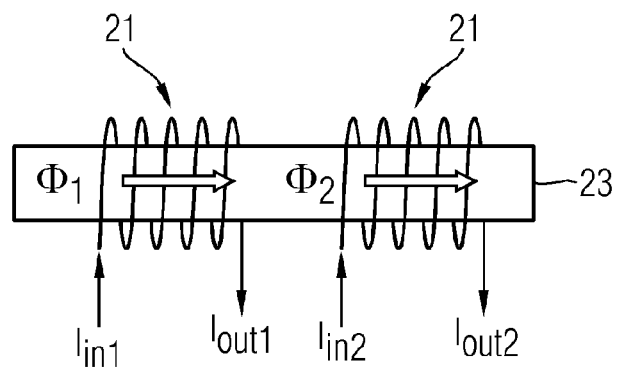
FIG. 3 is a schematic plan view of an embodiment of two coils.

FIG. 3 shows an embodiment of a coil arrangement. FIG. 3 represents a corresponding embodiment of the inductive isolation of individual stages in an IVA. Isolation is achieved by discrete inductances, which are magnetically interconnected. FIG. 3 shows a schematic representation of coupled coils of this type. FIG. 3 shows a section of a coil arrangement. According to this section, two coils 21 are arranged one after the other along an iron ring 23. The magnetic fluxes $\varphi_1$ and $\varphi_2$ are added to each other, thereby giving a total flux $\varphi_{Total}$. A corresponding inductance=$\varphi_{Total}/i_{Total}$. FIG. 3 shows respective input currents $I_{in}$ and output currents $I_{out}$. These two coils 21 are coupled, such that the total resulting magnetic flux is delivered accordingly.

Figure 4:
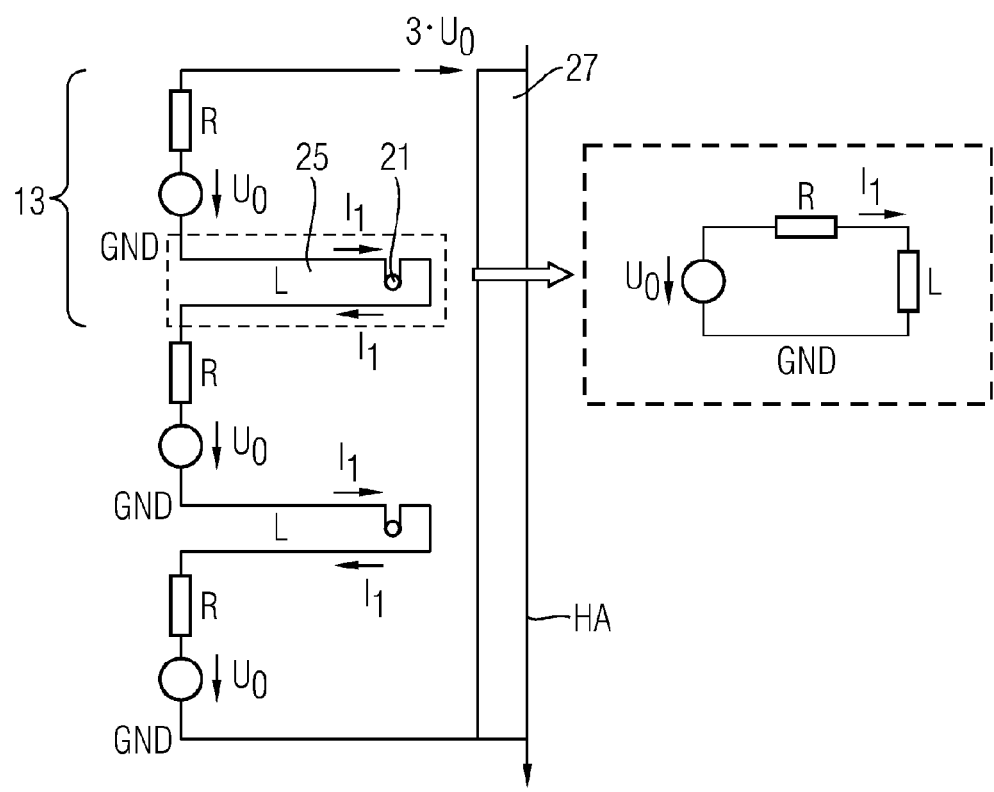
FIG. 4 is a circuit diagram of an embodiment of a coil arrangement.

FIG. 4 shows an embodiment of a coil arrangement. FIG. 4 shows a schematic representation of an IVA with coupled coils. Reference number 21 designates an arrangement of coils 21. On the right-hand side of FIG. 4, an equivalent circuit diagram is represented for the description of the magnetic isolation of one stage 13. FIG. 4 shows a schematic sectional view of an IVA with discrete and magnetically coupled coil elements or coils 21, arranged circumferentially to the IVA. In each individual stage 13, the coils 21 are arranged toroidally. The coils may also be fitted to another side of the inductance zone L. Alternatively, the coils 21 may be fitted to an end face of the inductance zone L, facing the inner conductor of the coaxial transmission line 27.

Figure 5:
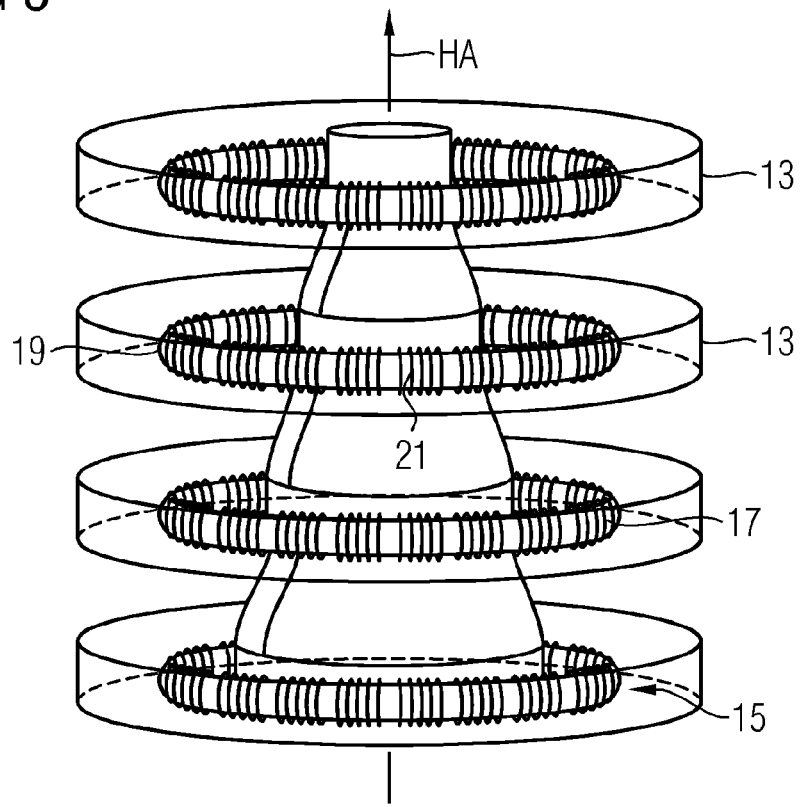
FIG. 5 is a schematic perspective view of an embodiment of a coil arrangement.

FIG. 5 shows an embodiment of a coil arrangement. FIG. 5 shows a plan view of the IVA, with discrete coupled coils. The stages 13 of the IVA are arranged one after the other along a main axis of wave propagation HA. Reference number 15 designates the first stage. Reference number 17 designates a rotationally symmetrical spatial extension, which is configured here as a torus 19. Coils 21 are arranged circumferentially around the torus 19.

The coils 21 are configured as air coils. This means that the rotationally symmetrical spatial extension 17 around and along which the coils 21 are configured to contain air only. According to this embodiment, no iron ring 23 is provided. FIG. 5 shows a schematic representation of an IVA with coils coupled, wherein connections for the infeed and outfeed of current in accordance with FIG. 3 are not represented.

The coils 21 may be configured either as pure air coils, or as air coils 21 with an iron core 23. In this case, the term "air coils" signifies that turns are formed in the ambient air only. Pure air coils 21 are only wound around a space which includes air. In general, long coils are employed, in which the coil length is significantly larger than the coil diameter, in order to minimize stray fields. Short coils may also be used, specifically in a combination of multiple coils, in order to reduce stray fields. Any iron core 23 present must not fill the entire interior volume of the coil, but can only constitute a proportion of the coil volume. For example, an interior coil volume for the totality of coils in a given stage is configured as a rotationally symmetrical spatial extension, for example as a torus 19. In a particular configuration, the space between two coils 21 in the circumferential direction of the IVA arrangement is completely or partially filled with iron, in order to concentrate the flux on the coil cross-section, thereby minimizing stray fields. Given that, in this arrangement, only small volumes between the individual modules are filled with iron, the total quantity of iron is effectively reduced, in comparison with the related art. According to the related art, the coils 21 may be configured as wire coils formed of litz wire, round-section wire or flat wire, for example. Strip-wound conductors also constitute a potential form of an embodiment of the coils 21. Alternatively, the coils 21 may be configured as double-wound coils 21. The coils 21 may also include a combination of two coils, such that a symmetrical infeed to each of the two coils is delivered from the exterior side of the feed, and a common outfeed is also arranged symmetrically in the center of the feed to another side of the air gap.

Figure 6:
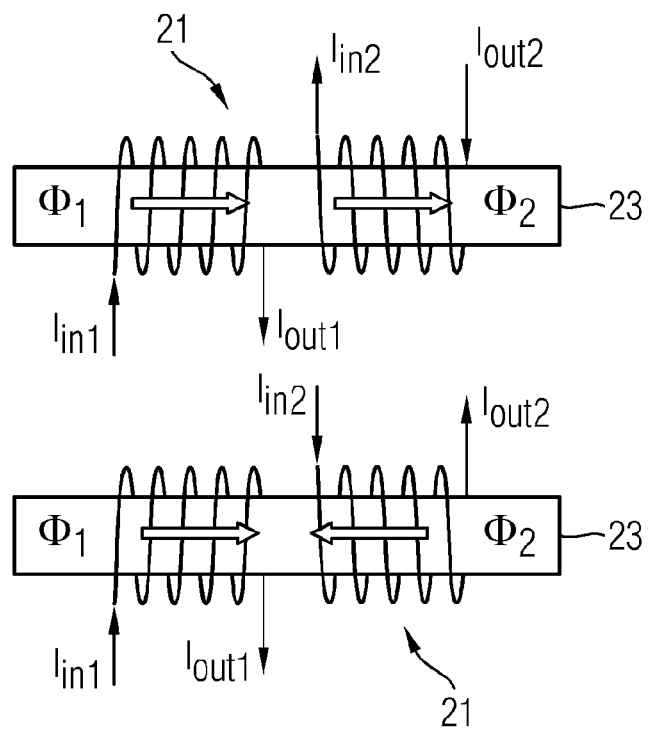
FIG. 6 is a schematic plan view of an embodiment of a discrete coil.

FIG. 6 shows an embodiment of coils. In this embodiment, a coil 21 is executed in the form of a double-wound turn. Accordingly, a double-wound turn exploits the properties of common-mode and push-pull signals. The push-pull signals generate an inductance L by the addition of the magnetic lines of flux. In the case of common-mode signals, the magnetic lines of flux ideally cancel each other out in total, such that the resulting inductance L=0. This is represented schematically in FIG. 6. Reference number 23 designates an iron ring, around which two mutually double-wound turns are arranged to form a coil 21. In the upper part of FIG. 6, the resulting magnetic flux for push-pull signals is represented, whereby the individual fluxes are added together to give $\varphi_{Total}$, and the resulting inductance is given by the relationship $L=\varphi_{Total}/i_{Total}$. The lower part of FIG. 6 represents the double-wound coil 21 upon the input of common-mode signals. The resulting magnetic flux $\varphi_{Total}$ for common-mode signals is given by the difference between the individual fluxes such that, for identical turns, the total flux $\varphi_{Total}$ is reduced to 0. Correspondingly, the total inductance is L=0×H. In FIG. 6, input currents are represented by $I_{in}$ and output currents are represented by $I_{out}$, with their corresponding directional arrows.

Figure 7:
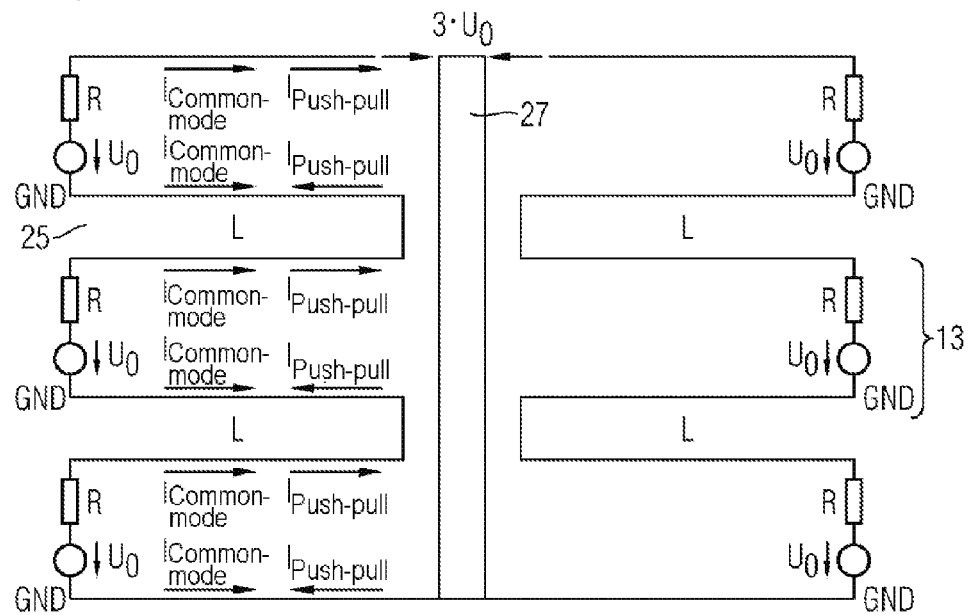
FIG. 7 is a schematic representation of an IVA with common-mode signals and push-pull signals.

FIG. 7 shows an embodiment of an IVA. In this arrangement, the coils 21 are respectively formed of double-wound turns. Correspondingly, FIG. 7 shows a schematic representation of an IVA with distributed common-mode and push-pull signals. Reference number 13 designates a respective stage of the IVA, whereby a stage 13 may also be designated as a cavity. The stages 13 are provided with cables 25, which are configured around a coaxial transmission line 27 in an axially symmetrical arrangement. FIG. 7 shows the respective directions of flow of the respective currents I, which may be delivered in the form of a common-mode current $I_{common-mode}$ or a push-pull current $I_{push-pull}$. In this case, the common-mode signal constitutes the pulse current, which is added together over the n stages. The push-pull signal is the current which flows in the respective inductance L. FIG. 7 shows the corresponding distribution of common-mode and push-pull signals.

Figure 8:
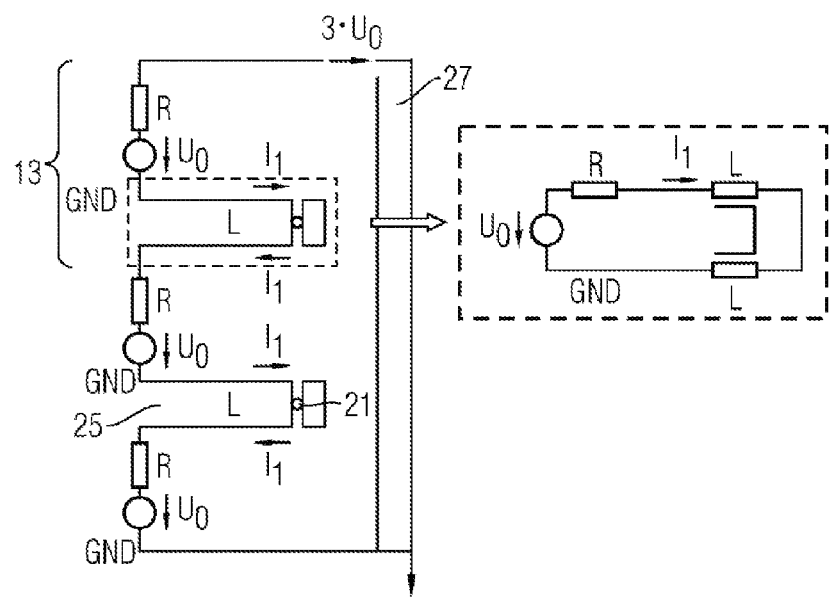
FIG. 8 is a circuit diagram of an embodiment of a coil arrangement.

FIG. 8 shows a an embodiment of a coil arrangement. According to this arrangement, a respective coil 21 is configured as a double-wound coil 21. FIG. 8 shows the stages 13 which are arranged along a main axis of wave propagation HA. In the left-hand half of the diagram, cables 25 are represented which are routed along the coaxial transmission line 27. On the right-hand side of FIG. 8, an equivalent circuit diagram is represented for the description of the magnetic isolation of a given stage 13. FIG. 8 shows a schematic representation of a corresponding IVA, indicating the location of the discrete double-wound coils 21. In this case, the discrete coils 21 are arranged in a cable 25. The double-wound coils 21 in each individual stage 13 are distributed toroidally whereby, in general, a stage includes a parallel arrangement of a number of sub-modules. The term "sub-modules" is known to be understood as the totality of all the active electrical components or the voltage sources in a given stage 13. The sub-modules for pulse generation in a single plane of the IVA are configured in a circular arrangement around the inner coaxial conductor, which constitutes the coaxial transmission line 27. The arrangement of double-wound coils 21 has the advantage that the respective inductances L for the current pulse are significantly smaller, or are appropriate for shorter pulse durations.

FIG. 9 shows an embodiment of a method. According to this method, high-voltage pulses are generated, specifically by an inductive voltage adder IVA. In S1, during pulse generation, electromagnetic fields in a series circuit of a number n of discrete stages of voltage sources arranged along a main axis of wave propagation are combined in a transformer. In S2, coupling-in inductances in each stage are configured as a number of discrete inductances, specifically discrete coils, which are magnetically coupled to one another in such a way that their magnetic fluxes are superimposed on one another and added to one another along a circular line which is rotationally symmetrical to the main axis of wave propagation. The main axis of wave propagation corresponds to the axis of symmetry of the coaxial transmission line 27 or to the axis of symmetry of the inner conductor thereof. The direction of the main axis of wave propagation HA is the direction in which electromagnetic waves are mainly propagated, starting from the first stage through to the last stage.

Various embodiments described herein to a device and a method for the generation of high-voltage pulses, specifically by an inductive voltage adder IVA, wherein a coupling-in inductance L for each stage 13 is formed of a number of discrete inductances, specifically discrete coils 21, which are magnetically coupled to one another in such a way that the magnetic fluxes are superimposed on one another and/or added to one another along a circular line, which is rotationally symmetrical to a main axis of wave propagation HA.

The various embodiments have been described in detail with particular reference and examples, but it will be understood that variations and modifications can be effected within the spirit and scope of the various embodiments covered by the claims which may include the phrase "at least one of A, B and C" as an alternative expression that means one or more of A, B and C may be used, contrary to the holding in *Superguide* v. *DIRECTV*, 69 USPQ2d 1865 (Fed. Cir. 2004).

The invention claimed is:

1. An apparatus that generates high-voltage pulses, comprising:
    a transformer, including a coaxial transmission line, and
    a series circuit of discrete stages of voltage sources arranged along a main axis of wave propagation, electromagnetic waves being propagated along the coaxial transmission line in each stage and being coupled in the coaxial transmission line by pulse currents,
    wherein each of the plurality of stages includes a plurality of discrete coils arranged in series along a respective circular line extending around the main axis of wave propagation, and
    wherein for each of the plurality of stages, the plurality of discrete coils in the respective stage produces a plurality of discrete inductances that generate the pulse currents, the discrete inductances produced by the plurality of discrete coils in the respective stage being magnetically coupled to each other such that magnetic fluxes of the discrete inductances are superimposed on one another and added to one another along the respective circular line of the respective stage to collectively define a coupling-in inductance provided by the respective stage.

2. The apparatus as claimed in claim 1, wherein the discrete inductances in each stage are arranged along a spatial extension around the coaxial transmission line, and the spatial extension is rotationally symmetrical to the main axis of wave propagation.

3. The apparatus as claimed in claim 2, wherein each spatial extension is at least partially filled with a ferromagnetic material.

4. The apparatus as claimed in claim 2, wherein the spatial extension has a cross-sectional surface circumferential to the main axis of wave propagation.

5. The apparatus as claimed in claim 4, wherein the cross-sectional surface is a circular surface, and the spatial extension is a torus.

6. The apparatus as claimed in claim 4, wherein each of the plurality of discrete inductances produced by each respective stage is produced a discrete coil encircling the cross-sectional surface of the respective stage.

7. The apparatus as claimed in claim 6, wherein each of the plurality of discrete coils of each respective stage includes two double-wound turns.

8. The apparatus as claimed in claim 6, wherein the plurality of discrete coils in each respective stage are arranged side by side along the cross-sectional surface of the respective stage.

9. The apparatus as claimed in claim 6, wherein the discrete coils in each respective stage are arranged (a) on a side of the cross-sectional surface of the respective stage facing the coaxial transmission line, or (b) on a radially-oriented side of the cross-sectional surface of the respective stage, or (c) in the cross-sectional surface of the respective stage.

10. The apparatus as claimed in claim 6, wherein each of the plurality of discrete coils of each respective stage is a discrete air coil.

11. The apparatus as claimed in claim 6, wherein a space between two adjoining discrete coils of a respective stage is at least partially filled with a ferromagnetic material.

12. The apparatus as claimed in claim 6, wherein each of the plurality of discrete coils of each respective stage includes wire turns formed of one of litz wire, round-section wire and flat wire.

13. The apparatus as claimed in claim 6, wherein each of the plurality of discrete coils of each respective stage includes a combination of two coils, into which a symmetrical infeed is arranged for input of current from an exterior side of the two coils, and out of which a symmetrical current outfeed is arranged in a center of an air gap between the two coils.

14. A method for generating high-voltage pulses, comprising:
    combining electromagnetic fields in a series circuit including discrete stages of voltage sources arranged along a main axis of wave propagation in a transformer; and
    coupling, in each stage of the plurality of stages, electromagnetic waves propagated along a coaxial transmission line by pulse currents,
    wherein each of the plurality of stages includes a plurality of discrete coils arranged in series along a respective circular line extending around the main axis of wave propagation, and
    wherein for each of the plurality of stages, the plurality of discrete coils in the respective stage produces a plurality of discrete inductances that generate the pulse currents, the discrete inductances produced by the plurality of discrete coils in the respective stage being magnetically coupled to each other such that magnetic fluxes of the discrete inductances are superimposed on one another and added to one another along the respective circular line of the respective stage to collectively define a coupling-in inductance provided by the respective stage.

15. The method as claimed in claim 14, wherein the discrete inductances in each stage are arranged along a spatial extension around the coaxial transmission line, and the spatial extension is rotationally symmetrical to the main axis of wave propagation.

16. The method as claimed in claim 15, wherein each spatial extension is at least partially filled with a ferromagnetic material.

17. The method as claimed in claim 15, wherein the spatial extension has a cross-sectional surface that is circumferential to the main axis of wave propagation.

18. The method as claimed in claim 17, wherein the cross-sectional surface is a circular surface, and the spatial extension is a torus.

19. The method as claimed in claim 14, wherein each of the plurality of discrete inductances produced by each respective stage is produced a discrete coil encircling the cross-sectional surface of the respective stage.

20. The method as claimed in claim 19, wherein the plurality of discrete coils in each respective stage are arranged side by side along the cross-sectional surface of the respective stage.

21. The method as claimed in claim 19, wherein each of the plurality of discrete coils of each respective stage includes two double-wound turns.

22. The method as claimed in claim 19, wherein the discrete coils in each respective stage are arranged (a) on a side of the cross-sectional surface of the respective stage facing the coaxial transmission line, or (b) on a radially-oriented side of the cross-sectional surface of the respective stage, or (c) in the cross-sectional surface of the respective stage.

23. The method as claimed in claim 19, wherein each of the plurality of discrete coils of each respective stage is a discrete air coil.

24. The method as claimed in claim 19, wherein a space between two adjoining discrete coils of a respective stage is at least partially filled with a ferromagnetic material.

25. The method as claimed in claim 19, wherein each of the plurality of discrete coils of each respective stage includes wire turns formed of one of litz wire, round-section wire and flat wire.

26. The method as claimed in claim 19, wherein each of the plurality of discrete coils of each respective stage includes a combination of two coils, into which a symmetrical infeed is arranged for input of current from an exterior side of the two coils, and out of which a symmetrical current outfeed is arranged in a center of an air gap between the two coils.

* * * * *